(12) United States Patent
Kobayashi (10) Patent No.: US 7,042,154 B2
(45) Date of Patent: May 9, 2006

(54) ORGANIC ELECTROLUMINESCENT DEVICE HAVING WIRING LINES UNDER THE PARTITION WALLS AND ELECTRONIC APPARATUS USING THE SAME

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 26 days.

(21) Appl. No.: 10/446,816

(22) Filed: May 29, 2003

(65) Prior Publication Data

US 2004/0012329 A1    Jan. 22, 2004

(30) Foreign Application Priority Data

Jun. 7, 2002    (JP) ............... 2002-167771

(51) Int. Cl.
 *H01L 51/50* (2006.01)
(52) U.S. Cl. ............ 313/506; 313/504; 313/505; 313/512; 315/169.3; 257/59; 257/88
(58) Field of Classification Search ........... 313/504, 313/505, 512, 506; 315/169.3; 257/88
See application file for complete search history.

(56) References Cited

U.S. PATENT DOCUMENTS

| | | | |
|---|---|---|---|
| 5,773,931 A | | 6/1998 | Shi et al. |
| 6,140,765 A * | | 10/2000 | Kim et al. ............ 313/506 |
| 6,384,529 B1 * | | 5/2002 | Tang et al. ............ 313/506 |
| 6,538,374 B1 * | | 3/2003 | Hosokawa ............ 313/504 |
| 6,590,337 B1 * | | 7/2003 | Nishikawa et al. ......... 313/509 |
| 6,683,410 B1 * | | 1/2004 | Hitoshi ............ 313/506 |
| 6,689,492 B1 * | | 2/2004 | Yamazaki et al. .......... 428/690 |
| 6,798,132 B1 * | | 9/2004 | Satake ............ 313/495 |
| 6,900,470 B1 * | | 5/2005 | Kobayashi et al. ............ 257/88 |
| 2001/0024083 A1 | | 9/2001 | Yamazaki et al. |
| 2002/0033664 A1 * | | 3/2002 | Kobayashi ............ 313/504 |
| 2002/0101152 A1 | | 8/2002 | Kimura et al. |
| 2002/0158835 A1 * | | 10/2002 | Kobayashi et al. ......... 345/100 |
| 2003/0094607 A1 | | 5/2003 | Guenther et al. |

FOREIGN PATENT DOCUMENTS

| | | |
|---|---|---|
| EP | 0 553 496 | 8/1993 |
| EP | 0 989 534 | 3/2000 |
| JP | A-57-51781 | 3/1982 |
| JP | A-59-194393 | 11/1984 |
| JP | A-63-70257 | 3/1988 |
| JP | A-63-175860 | 7/1988 |
| JP | A-2-135359 | 5/1990 |
| JP | A-2-135361 | 5/1990 |
| JP | A-2-209988 | 8/1990 |
| JP | A-3-37992 | 2/1991 |
| JP | A-3-152184 | 6/1991 |

OTHER PUBLICATIONS

European Search Report Modified Abstract

* cited by examiner

*Primary Examiner*—Karabi Guharay
*Assistant Examiner*—Sikha Roy
(74) *Attorney, Agent, or Firm*—Oliff & Berridge, PLC (57) ABSTRACT

The invention provides an organic electroluminescent device, a method of manufacturing the organic electroluminescent device, and an electronic apparatus in which it is possible to make an entire display device compact as well as to reduce the manufacture cost. An organic electroluminescent device includes organic electroluminescent elements that each have a light-emitting layer between an anode and a cathode and that are formed on a substrate. The device includes lead-out wiring lines that are electrically connected to the cathodes.

18 Claims, 4 Drawing Sheets

ORGANIC ELECTROLUMINESCENT DEVICE HAVING WIRING LINES UNDER THE PARTITION WALLS AND ELECTRONIC APPARATUS USING THE SAME

BACKGROUND OF THE INVENTION

1. Field of Invention

The present invention relates to an organic electroluminescent device, a method of manufacturing the organic electroluminescent device, and an electronic apparatus.

2. Description of Related Art

Conventionally, an organic electroluminescent (hereinafter, simply referred to as EL) devices have been considered for use as display means in portable apparatuses such as mobile phones or personal computers. In organic EL devices, a light-emitting layer (organic EL layer) is provided between two opposing electrodes, electric current flows between the electrodes, and the light emitted from the light-emitting layer is used as display light. Also, by providing a plurality of light-emitting layers on a plane, and by driving pixels each consisting of a set of one light-emitting layer and the electrodes, it is possible to configure a display apparatus that can display any image.

SUMMARY OF THE INVENTION

However, in conventional organic EL devices, when forming display devices having a large screen, it is necessary to make wiring lines for supplying electric current to the electrodes thick because the power consumption increases. In conventional organic EL devices which are display devices formed to have a large screen and in which the light transmitted through a substrate is used as display light, there occurs a problem in that the aperture ratio, expressed as the ratio of the area of a light-emitting region to that of a display region, decreases. Further, as a result, it is necessary to raise the brightness within pixels so as to obtain the required display brightness. As a result, there is a problem in that the product lifetime is reduced.

In order to cope with these problems, an organic EL device having a construction such that display light is emitted from the side (sealing member side) opposite to the substrate, instead of using the light transmitted through the substrate as display light has been proposed.

However, since the conventional organic EL device having a construction such that display light is emitted from the side (sealing member side) opposite to the substrate side necessitates raising the light transmissivity of electrodes at the sealing member side, it is necessary to form auxiliary electrodes. Accordingly, the conventional organic EL device has a problem in that the manufacturing process is complicated due to the formation of the auxiliary electrodes and the manufacturing cost therefore increases.

Further, in a conventional organic EL device (substrate-side light emission type) having a construction such that the light transmitted through the substrate is used as display light, a conductive pattern (cathode lead-out electrode) for supplying electric current to electrodes (cathodes) has been provided in the form of a so-called picture frame around the substrate. The area occupied by the picture frame with respect to the whole area of the substrate is not negligible, and therefore, there is a problem in that the organic EL device tends to because larger and more expensive.

The present invention has been achieved in consideration of the above circumstances. Therefore, it is an object of the invention to provide an organic electroluminescent device, a method of manufacturing the organic electroluminescent device, and an electronic apparatus in which it possible to make the whole display device compact as well as to reduce the manufacturing cost.

[Means for Solving the Problems]

In order to achieve the above object, the present invention provides an organic electroluminescent device in which organic electroluminescent elements each having a light-emitting layer between a first electrode and a second electrode are formed on a substrate, the device comprising: lead-out wiring lines electrically connected to the first electrodes or the second electrodes.

According to such an invention, since electric current flowing into the first electrodes or the second electrodes can be made to flow through the lead-out wiring lines, it is not necessary to provide auxiliary cathodes, which have been required in the conventional art. Therefore, according to the present invention, it is possible to make the whole organic EL device compact and to reduce the manufacturing cost.

Further, according to the present invention, it is possible to avoid the problem that has occurred in a conventional substrate-side light emission type organic EL device, i.e., the problem that the area of cathode lead-out electrodes provided around the substrate is apt to increase, and it is therefore possible to make the organic EL device compact and to reduce the manufacturing cost.

Further, in the organic electroluminescent device according to the present invention, it is preferable that the first electrodes be pixel electrodes, and the light-emitting layers be made of an organic electroluminescent material.

According to such an invention, since electric current (reverse current is also possible), flowing in the counter electrodes (second electrodes) via the light-emitting layers from the pixel electrodes (first electrodes), can flow through the lead-out wiring lines, it is preferable that conductivity of the second electrodes be ensured to allow sufficient electric current to flow into the light-emitting layers serving as each pixel. Accordingly, auxiliary cathodes, which have been required in the conventional art, are not necessary. For this reason, according to the present invention, it is possible to reduce the manufacturing cost in comparison with the conventional organic EL device.

Further, in the organic electroluminescent device according to the present invention, it is preferable that the lead-out wiring lines be disposed so as not to overlap the light-emitting layers.

According to such an invention, since the lead-out wiring lines do not interrupt the light emitted from the light-emitting layers, it is possible to provide an organic EL device with high brightness and low power consumption.

Further, in the organic electroluminescent device according to the present invention, it is preferable that the light-emitting layers be formed by dividing a light-emitting layer, and the light-emitting layers are distributed horizontally; and the lead-out wiring lines are disposed between the respective light-emitting layers.

According to such an invention, it is possible to prevent the lead-out wiring lines from interrupting the light emitted from the light-emitting layers.

Further, in the organic electroluminescent device according to the present invention, it is preferable that partition walls partitioning the light-emitting layers be provided on the substrate; and a part of each lead-out wiring line is disposed below the partition walls.

According to such an invention, it is possible to make the organic EL device compact by disposing a part of each lead-out wiring line below the partition walls (banks).

Further, in the organic electroluminescent device according to the present invention, it is preferable that partition walls partitioning the light-emitting layers be provided on the substrate; at least two partition walls be provided between the partitioned light-emitting layers adjacent to each other; and at least a part of each lead-out wiring line be disposed between the at least two partition walls.

According to such an invention, it is possible to make the manufacturing process simple and easy, and to make the organic EL device compact, by disposing the lead-out wiring lines between the respective partition walls.

Further, in the organic electroluminescent device according to the present invention, it is preferable that connecting parts between the lead-out wiring lines and the first or second electrodes be disposed between the at least two partition walls.

According to such an invention, it is possible to simplify the manufacturing process of the organic EL device and to make the organic EL device compact.

Further, in the organic electroluminescent device according to the present invention, it is preferable that the second electrodes be provided so as to cover at least a part of each lead-out wiring lines and a top face of the light-emitting layers.

According to such an invention, when the second electrodes are formed, it is possible to make connections between the second electrodes and the lead-out wiring lines, and connections between the second electrodes and the light-emitting layers. For this reason, it is possible to simplify the manufacturing process of the organic EL device and to make the organic EL device compact.

Further, in the organic electroluminescent device according to the present invention, it is preferable that the first electrodes be anodes, and the second electrodes be cathodes.

Further, in the organic electroluminescent device according to the present invention, it is preferable that the first electrodes be cathodes, and the second electrodes be anodes.

Further, in the organic electroluminescent device according to the present invention, it is preferable that the lead-out wiring lines be made of a high molecular material.

Further, in the organic electroluminescent device according to the present invention, it is preferable that the lead-out wiring lines be made of a low molecular material.

Further, in the organic electroluminescent device according to the present invention, it is preferable that a transparent sealing substrate be provided above the organic electroluminescent elements formed on the substrate; and light emitted from the light-emitting layers include light transmitted through the sealing substrate as display light.

According to such an invention, auxiliary cathodes can be omitted in a sealing-side light emission type organic EL device, and it is possible to make the organic EL device compact and low cost.

Further, in the organic electroluminescent device according to the present invention, it is preferable that the substrate be transparent; and light emitted from the light-emitting layers include light transmitted through the substrate as display light.

According to such an invention, in a substrate-side light emission type organic EL device, the conventional cathode lead-out electrodes provided around a substrate can be omitted. As a result, it is possible to make the organic EL device compact and low cost.

Further, the present invention provides a method of manufacturing an organic electroluminescent device in which organic electroluminescent elements each having a light-emitting layer between a first electrode and a second electrode are formed on a substrate, comprising forming the first electrodes on the substrate; forming lead-out wiring lines electrically connected to the first electrodes or the second electrodes; forming the light-emitting layers on the first electrodes; and forming the second electrodes so as to cover at least a part of each lead-out wiring line and the light-emitting layers.

According to such an invention, when the second electrodes are formed, it is possible to make connections between the second electrodes and the lead-out wiring lines, and connections between the second electrodes and the light-emitting layers. For this reason, it is possible to simplify make the manufacturing process of the organic EL device and to make the organic EL device compact.

Further, in the method of manufacturing an organic electroluminescent device according to the present invention, it is preferable that charge-injection layers be formed between the first electrodes and the light-emitting layers.

According to such an invention, it is possible to provide an organic EL device with high brightness and low power consumption.

Further, in the method of manufacturing an organic electroluminescent device according to the present invention, it is preferable that charge-transport layers are formed between the first electrodes and the light-emitting layers.

According to such an invention, it is possible to provide an organic EL device with high brightness and low power consumption.

Further, in the method of manufacturing an organic electroluminescent device according to the present invention, it is preferable that the method further comprise forming a plurality of partition walls on the substrate after forming the lead-out wiring lines and before forming the light-emitting layer, the light-emitting layers be formed in a region surrounded by the partition wall; and the second electrodes be formed so as to cover the partition walls, the light-emitting layer, and at least a part of each lead-out wiring line.

According to such an invention, it is possible to form light-emitting layers serving as pixels simply, easily, and precisely by providing partition walls partitioning the light-emitting layers. Moreover, since the second electrodes are formed so as to cover at least a part of each lead-out wiring line, the partition walls, and the light-emitting layer, connections between the second electrodes and the lead-out wiring lines and connections between the second wiring lines and the light-emitting layers can be made substantially at the same time, and the organic EL device can be made compact.

Further, an electronic apparatus according to the present invention comprises an organic electroluminescent device as described above.

According to the present invention, it is possible to configure a compact electronic apparatus while making its display part relatively large, and it is possible to further reduce the manufacturing cost and to extend the product lifetime.

Further, the electronic apparatus according to the present invention comprises an organic electroluminescent device manufactured by the method of manufacturing an organic electroluminescent device as described above.

According to the present invention, it is possible to configure a compact electronic apparatus having a high

DETAILED DESCRIPTION OF PREFERRED EMBODIMENTS

An organic EL device according to a preferred embodiment of the present invention will be described below with reference to the accompanying drawings.

(Structure)

Figure 1:
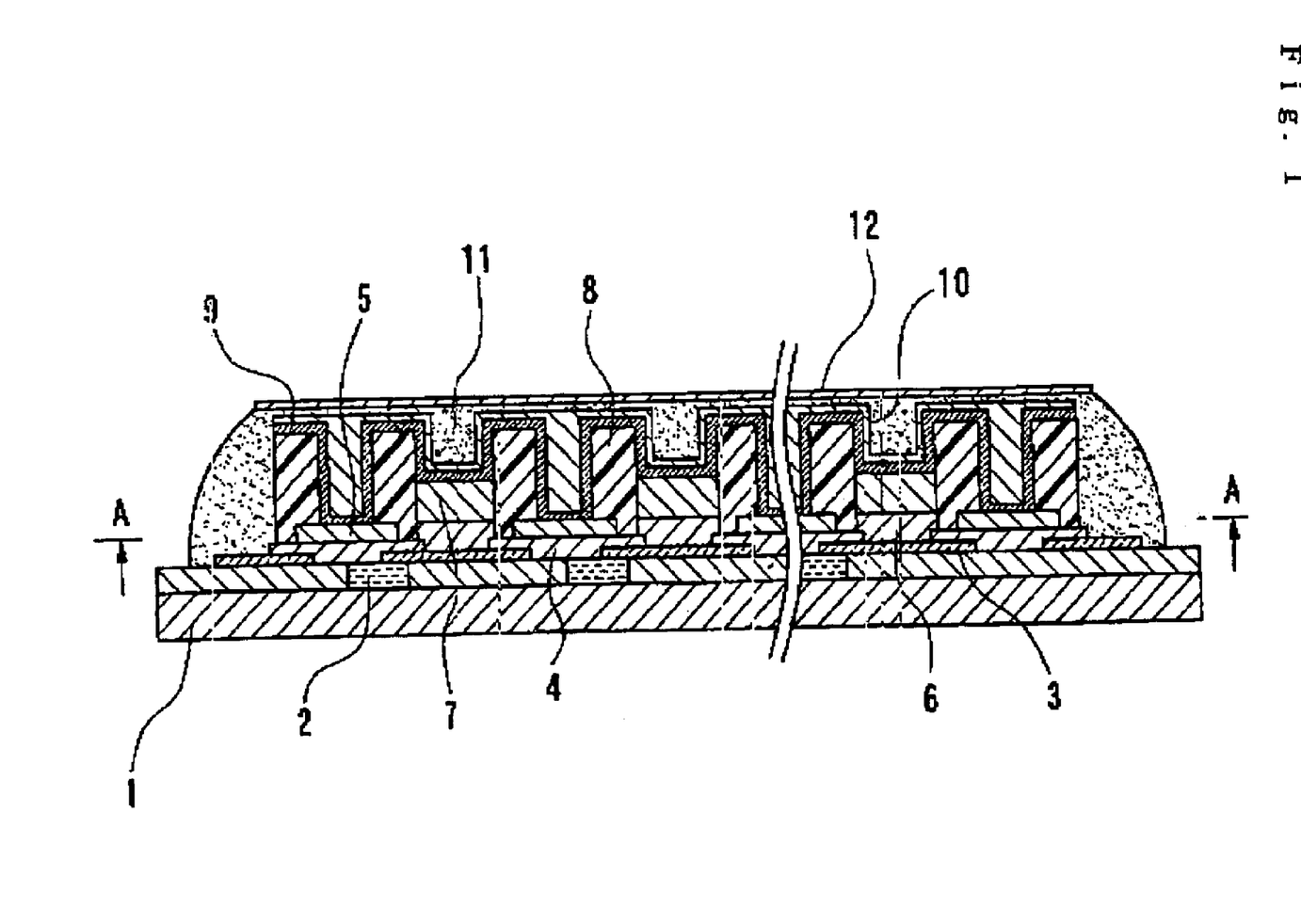
FIG. 1 is a cross-sectional view of essential parts according to a preferred embodiment of the present invention.

FIG. 1 is a cross-sectional view of essential parts illustrating an organic EL device according to a preferred embodiment of the present invention. The organic EL device is a sealing-side light emission type organic EL device, which has a structure in which light is emitted from a sealing substrate 12. Moreover, the organic EL device can also be applied to a substrate-side light emission type organic EL device, which has a structure in which light is emitted from a substrate 1.

The organic EL device has the substrate 1, light-emitting layers (EL layers) 7 made of an organic EL material, which is provided at one side of the substrate 1 and sandwiched between pairs of cathodes (first electrodes) 9 and anodes (second electrodes) 3, hole-injection layers (transport layers) 6, and a sealing substrate 12. Here, the cathodes 9 are transparent cathodes, and the anodes 3 are reflective electrodes. The anodes 3 also act as pixel electrodes provided at each light-emitting layer 7 serving as a pixel.

Further, the light-emitting layers 7 are partitioned, that is, it is divided into a plurality of light-emitting layers, and distributed horizontally by a plurality of partition walls (banks) 8, thereby forming individual pixels. Further, $SiO_2$ (silicon oxide) 4 is formed under the partition walls 8. Further, the sealing substrate 12 and the substrate 1 are bonded together by an adhesive layer 11. Also, organic EL elements consisting of the cathodes 9, the light-emitting layers 7, the hole-injection layers (transport layers) 6, and the anodes 3 are sealed by the sealing substrate 12 and the adhesive layer 11. Further, the cathodes 9 are covered at the sealing substrate 12 by a protective layer 10. Moreover, thin film transistors (TFTs) 2 are provided on the substrate 1 for switching electric current flowing through the anodes 3, etc.

Furthermore, in this organic EL device, lead-out wiring lines 5 electrically connected to the cathodes 9 are disposed between the respective light emitting layers 7. That is, the lead-out wiring lines 5 are disposed so as not to overlap the light-emitting layers 7. Further, a part of each lead-out wiring line 5 is disposed below the partition walls 8. Also, the lead-out wiring lines 5, are disposed so as to be sandwiched between two partition walls, as shown in FIG. 1.

Figure 2:
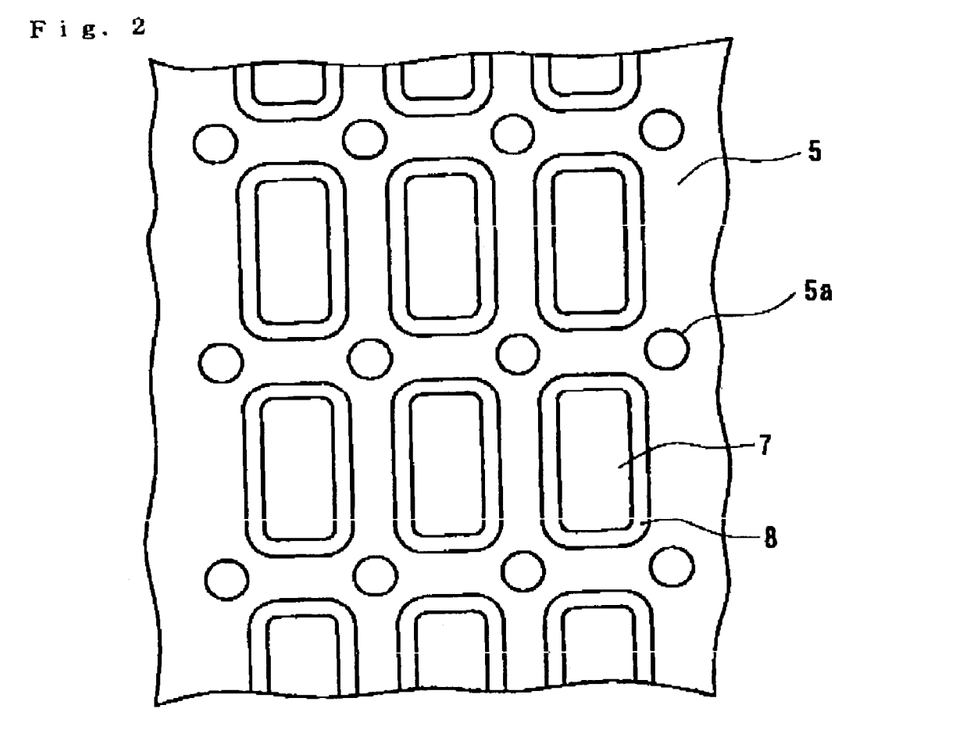
FIG. 2 is a plan view of area AA in FIG. 1.

The structure of the lead-out wiring lines 5 is described in more detail with reference to the drawings. FIG. 2 is a plan view illustrating the area AA in FIG. 1. Each wiring line 5 shown in FIG. 1 is actually formed of a continuous conductive pattern. Each of the plurality of light emitting layers 7 is provided within the conductive pattern so as to be surrounded by the partition walls 8. Also, the lead-out wiring lines 5 and the cathodes 9 are connected to each other with a plurality of connecting parts 5a. Each connecting part 5a is disposed so as to be surrounded by four partition walls 8. The transparent cathodes 9 are provided so as to cover the lead-out wiring lines 5, the partition walls 8 and a top face of the light-emitting layers 7.

As the material for forming the lead-out wiring lines 5, high molecular materials or low molecular materials can be used. For example, the lead-out wiring lines 5 may have a structure in which aluminum is sandwiched between tantalum. Further, the lead-out wiring lines 5 may be formed of tantalum, tungsten, aluminum, etc.

As the material for forming the substrate 1, since the present organic EL device is of the sealing-side light emission type, opaque materials can be used, and a material in which an insulation treatment, such as surface oxidation, is performed on ceramics such as alumina or metal sheets such as stainless steel, thermosetting resin, thermoplastic resin, etc. can be used. As the material of the sealing substrate 12, a transparent or semi-transparent material through which light can be transmitted is used.

On the other hand, as the material for forming the substrate 1 when the present invention is applied to a substrate-side light emission type organic EL device, a transparent or semi-transparent material through which light can be transmitted, for example, transparent glass, quartz, sapphire, or transparent synthetic resin such as polyester, polyacrylate, polycarbonate, and polyetherketone can be used. In particular, as the material for forming the substrate 1, inexpensive soda glass is very suitable. Further, as the material of the sealing substrate 12 in this case, a metallic laminate film may be used.

As the material of the anodes 3, a material made of indium tin oxide (ITO), etc., which has a large work function, is used. As the material of the hole-injection layer 6, for example, polythiophene, polystyrene sulfonic acid, polypyrrole, polyaniline, and derivatives thereof, are mentioned as examples as high polymer materials. Further, in the case of using low polymer materials, a hole-injection layer and a hole-transport layer may be laminated. In such a case, as the material for forming the hole-injection layer, for example, copper phthalocyanine (CuPc), polyphenylenevinylene as polytetrahydrothiophenylphenylene, 1,1-bis-(4-N,N-ditrilaminophenyl)cyclohexane, or tris(8-hydroxyquinoline) aluminum are mentioned as examples, but copper phthalocyanine (CuPc) is preferably used. Further, the material of the hole-transport layer includes triphenylamine derivatives (TPD), pyrazoline derivatives, allylamine derivatives, stilbene derivatives, triphenyldiamine derivatives, etc. Specifically, the materials described in Japanese Unexamined Patent Applications Publication Nos. 63-70257 and 63-175860, and Japanese Unexamined Patent Application Publication Nos. 2-135359, 2-135361, 2-209988, 3-37992 and 3-152184 are mentioned as examples, but triphenyldiamine derivatives is preferable, and 4,4'-bis(N(3-methylphenyl)-N-phenylamino)biphenyl is considered most preferable.

As the material for forming the light-emitting layers 7, high-molecular luminescent materials or low-molecular organic luminescent pigments, i.e., luminescent materials such as various fluorescent materials or phosphorescent materials can be used. Among conjugated-high molecular including the luminescent materials, a material including arylenevinylene or polyfluorene structure is more preferable. As for low-molecule luminescent materials, for example, naphthalene derivatives, anthracene derivatives, perylene derivatives, pigments such as polymethine system, kisatene system, coumarine system, and cyanine system, metal complex such as 8-hydroquinoline and derivatives thereof, aromatic amine, tetrapehnylcyclopentadiene derivatives, or other known materials described in Japanese Unexamined Patent Application Publication Nos. 57-51781 and 59-194393 can be used. The cathode 7 is preferably a metal electrode made of calcium (Ca), aluminum (Al), magnesium (Mg), gold (Au), silver (Ag), etc.

Moreover, electron-transport layers or electron-injection layers may be provided between the cathodes 9 and the light-emitting layers 7, if necessary. As the material for forming the electron transport layers, metal complexes including oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluororenone and derivatives thereof, diphenyldicyanoethylene and derivatives thereof, diphenoquinone and derivatives thereof, and 8-hydroxyquinoline and derivatives thereof, are mentioned as examples, though the material is not limited to these. Specifically, similar to the material forming the aforementioned hole-transport layer, the materials described in Japanese Unexamined Patent Applications Publication Nos. 63-70257 and 63-175860, and Japanese Unexamined Patent Applications Publication Nos. 2-135359, 2-135361, 2-209988, 3-37992 and 3-152184 are mentioned as examples. In particular, 2-4(biphenylyl)-5-(4-t-butylphenyl)-1,3,4-oxadiazole, benzoquinone, anthraquinone, and tris(8-quinolianol) aluminum are considered most preferable.

Although not shown, the organic EL device of this embodiment is an active matrix type in which a plurality of data lines and a plurality of scanning lines are actually disposed in a matrix on the substrate 1. Conventionally, the aforementioned organic EL elements are connected via driving TFTs, such as switching transistors and driving transistors, to each pixel disposed in a matrix, which are partitioned by the scanning lines and the data lines. Then, when driving signals are supplied via the data lines and the scanning lines, electric current flows between the electrodes, and the light-emitting layers 7 of the organic EL elements emit light. As a result, light is emitted to the outer surface of the sealing substrate 12, thereby turning on the pixel.

By the above structure, in the organic EL device of this embodiment, electric current flowing in the transparent cathode 9 through each light-emitting layer 7 forming a pixel can flow out of the organic EL device through the lead-out wiring lines 5. Thus, it is preferable that conductivity of the cathodes 9 be ensured to allow sufficient electric current to flow into each pixel (light-emitting element 7). Accordingly, auxiliary cathodes, which have been required in the conventional art, are not necessary. For this reason, according to the organic EL device of this embodiment, it is possible to reduce the manufacturing cost in comparison with a conventional organic EL device.

Further, in the case where the present invention is applied to a substrate-side light emission type organic EL device, it is not necessary to provide a conductive pattern (picture frame) serving as a cathode lead-out electrode at the peripheral portion of a substrate, and therefore it is possible to manufacture a compact organic EL device at low cost.

(Manufacturing Method)

Next, a method of manufacturing an organic EL device according to the preferred embodiment of the present invention will be described with reference to FIG. 1 and FIG. 2.

First, indium tin oxide (ITO), etc. is formed on a substrate 1 where TFTs 2 are provided, thereby providing anodes 3. Next, $SiO_2$ (silicon oxide) 4 is provided on the substrate 1. Finally, lead-out wiring lines 5 are provided on $SiO_2$ (silicon oxide) 4.

Next, partition walls 8 made of resin are provided on the $SiO_2$ (silicon oxide) 4 and the lead-out wiring lines 5. Then, hole-injection layers 6 are formed in a region above the anodes 3 surrounded by the partition walls 8, and light-emitting layers 7 are formed on the hole-injection layers 6.

Next, transparent cathodes 9 are provided so as to cover the partition walls 8, the lead-out wiring lines 5, and the top face of the light-emitting layers 7. This allows the cathodes 9 to be connected to the lead-out wiring lines 5 and the light-emitting layers 7. Next, a protective layer 10 is formed on the top face of the cathodes 9. Next, an adhesive is applied onto the protective layer 10 and organic EL elements, and the sealing substrate 12 is pressed onto the adhesive, thereby forming an adhesive layer 11 and mounting the sealing substrate 12.

Figure 3:
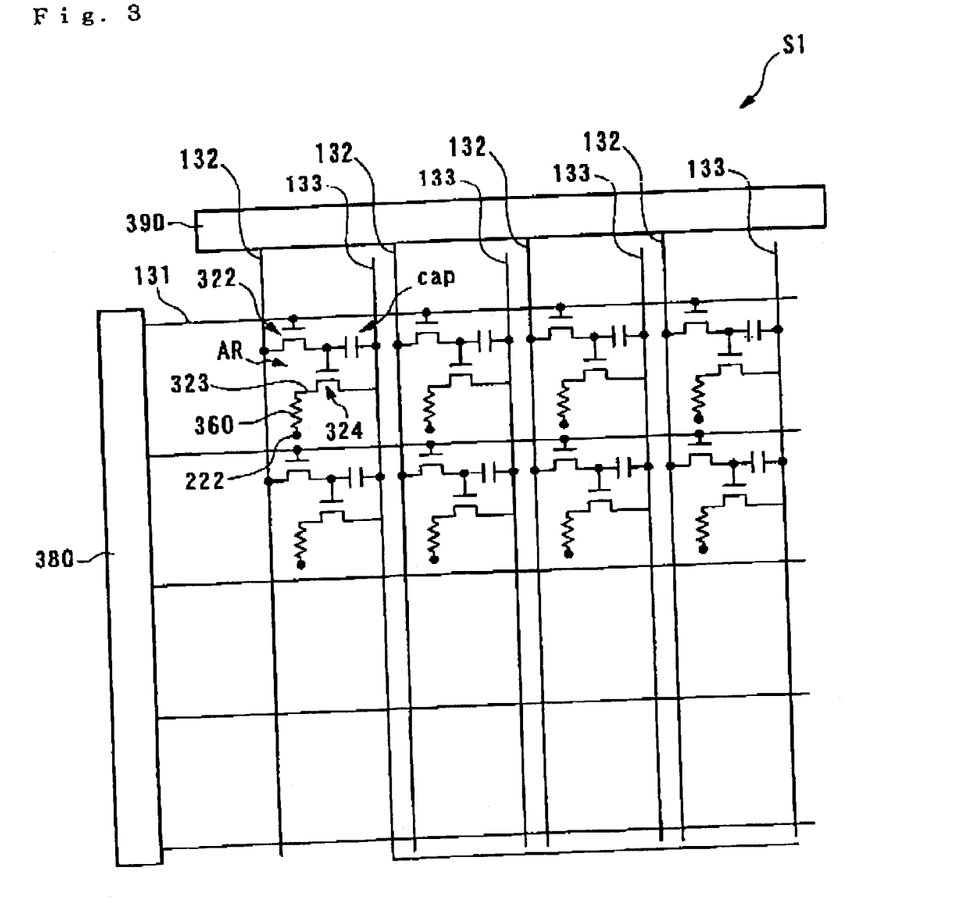
FIG. 3 is a circuit diagram illustrating an active matrix type display device.

FIG. 3 is a circuit diagram illustrating an example where an organic EL device (electro-optical device) according to this embodiment is applied to an active matrix type display device.

As shown in FIG. 3, an organic EL device S1 is constituted such that a plurality of scanning lines 131, a plurality of signal lines 132 extending in a direction intersecting the scanning lines 131, and a plurality of common power supply lines 133 extending parallel to the signal lines 132 are wired on the substrate, and a pixel (pixel region) AR is provided at each intersection between the scanning lines 131 and the signal lines 132.

The signal lines 132 are provided with a data line driving circuit 390 including shift registers, level shifters, video lines, and analog switches.

On the other hand, the scanning lines 131 are provided with a scanning line driving circuit 380 including shift registers and level shifters. Further, each pixel region AR is provided with a first transistor 322 where scanning signals are supplied to gate electrodes via the scanning lines 131, a storage capacitor cap for holding image signals supplied from the signal lines 132 via the first transistor 322, a second transistor 324 where the image signals held by the storage capacitor cap are supplied to the gate electrodes, a pixel electrode 323 into which, when it is electrically connected via the second transistor 324 to the common power supply line 133, driving current flows from the common power supply line 133, and a light-emitting layer 360 sandwiched between the pixel electrode (anode) 323 and a counter electrode (cathode) 222.

Based on such a constitution, when the scanning lines 131 are driven to turn on the first transistors 322, the potential of the signal lines 132 at that time is held in the storage capacitors cap, and the conduction state of the second transistors 324 is determined in accordance with the state of the storage capacitors cap. Then, current flows into the pixel electrodes 323 from the common power supply lines 133 via channels of the second transistors 324. Moreover, electric current flows into the counter electrode 222 via the light-emitting layers 360, thereby causing the light-emitting layers 360 to emit in accordance with the amount of electric current flowing therethrough.

Here, since electric current flowing into the counter electrode (cathode) 222 flows to the outside of the present organic EL device via the lead-out wiring lines 5 in FIG. 1 and FIG. 2, auxiliary electrodes, which have been required in the conventional art, need not be provided in the present organic EL device.

(Electronic Apparatus)

Examples of electronic apparatuses comprising the electro-optical device (organic EL device) of the above embodiment will be described.

Figure 4:
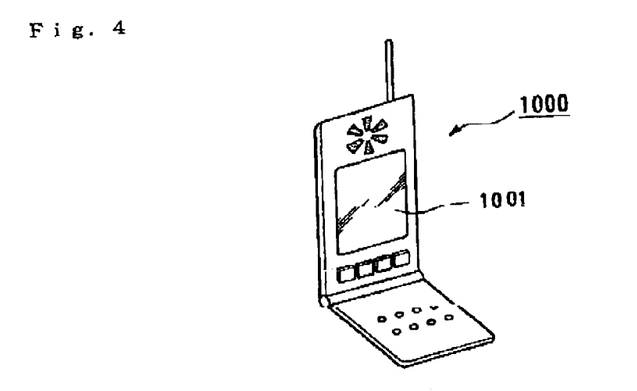
FIG. 4 illustrates an example of an electronic apparatus comprising the electro-optical device of the present embodiment.

FIG. 4 is a perspective view illustrating an example of a mobile phone. In FIG. 4, reference numeral 1000 denotes a main body of the mobile phone, and reference numeral 1001 denotes a display part using the above organic EL device.

Figure 5:
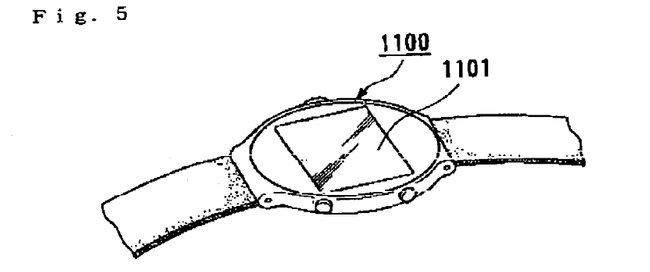
FIG. 5 illustrates an example of an electronic apparatus comprising the electro-optical device of the present embodiment.

FIG. 5 is a perspective view illustrating an example of a wristwatch-type electronic apparatus. In FIG. 5, reference numeral 1100 denotes a main body of the watch. Reference numeral 1101 denotes a display part using the above organic EL device.

Figure 6:
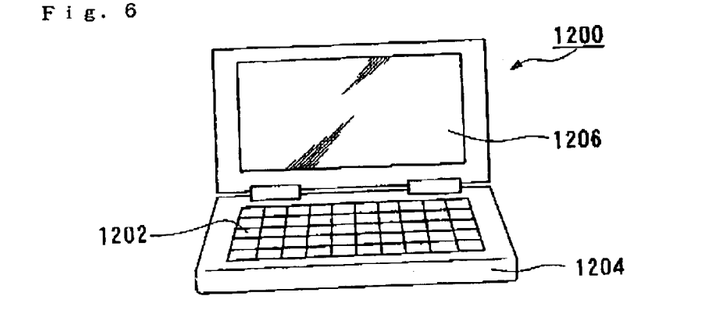
FIG. 6 illustrates an example of an electronic apparatus comprising the electro-optical device of the present embodiment.

FIG. 6 is a perspective view illustrating an example of a portable information processing apparatus such as a word processor or a personal computer. In FIG. 6, reference numeral 1200 denotes an information processing apparatus, reference numeral 1202 denotes an input part such as a keyboard, reference numeral 1204 denotes a main body of the information processing apparatus, and reference numeral 1206 denotes a display part using the above organic EL device.

The electronic apparatuses shown in FIG. 4 to FIG. 6 comprise an organic EL device according to the above embodiment. As a result, a display part thereof can be made relatively large as well as compact. Further, it is possible to reduce the manufacturing cost and to extend the product lifetime.

Moreover, the technical scope of the present invention is not limited to the above embodiment: various modifications can be made without departing from the spirit and scope of the present invention. Specific materials, layer constitutions, etc., which are mentioned as examples in the embodiment, are merely examples, and appropriate modifications can be made.

For example, the organic EL device according to the above embodiment is constituted such that the anodes 3 serve as pixel electrodes, the cathode 9 serves as a counter electrode, and the lead-out wiring lines 5 are connected to the cathode 9. However, it may be constituted such that the cathode 9 serves as a pixel electrode, the anode 3 serves as a counter electrode, the lead-out wiring lines 5 are connected to the anode 3.

[Advantages]

As is apparent from the above description, according to the present invention, the lead-out wiring lines connected to the first electrodes or the second electrodes (cathodes or anodes) are provided. As a result, it is possible to make the whole display device compact and to reduce the manufacturing cost thereof.

What is claimed is:

1. An organic electroluminescent device, comprising:
a substrate;
organic electroluminescent elements, each having a light-emitting layer between a first electrode and a second electrode, formed on the substrate;
a partition wall separating adjacent light-emitting layers;
an insulating layer disposed under the partition wall and disposed partially over the first electrode; and
a lead-out wiring line electrically connected to at least one of the first electrode and the second electrode, the lead-out wiring line being disposed between the partition wall and the insulating layer.

2. The organic electroluminescent device according to claim 1, the first electrodes being pixel electrodes, and the light-emitting layer being made of an organic electroluminescent material.

3. The organic electroluminescent device according to claim 2, the second electrodes being provided so as to cover at least a part of each lead-out wiring line and a top face of the light-emitting layers.

4. The organic electroluminescent device according to claim 1, the lead-out wiring lines being disposed so as not to overlap the light-emitting layers.

5. The organic electroluminescent device according to claim 1, the light-emitting layers being formed by dividing a light-emitting layer, and the light-emitting layers being distributed horizontally; and
the lead-out wiring lines being disposed between the respective light-emitting layers.

6. The organic electroluminescent device according to claim 1,
at least two partition walls being provided between the light-emitting layers adjacent to each other; and
at least a part of each lead-out wiring line being disposed between the at least two partition walls.

7. The organic electroluminescent device according to claim 6, further including connecting parts between the lead-out wiring lines and at least one of the first and second electrodes disposed between the at least two partition walls.

8. The organic electroluminescent device according to claim 1, the first electrodes being anodes, and the second electrodes being cathodes.

9. The organic electroluminescent device according to claim 1, the first electrodes being cathodes, and the second electrodes being anodes.

10. The organic electroluminescent device according to claim 1, each of the lead-out wiring lines being made of a high molecular material.

11. The organic electroluminescent device according to claim 1, each of the lead-out wiring lines being made of a low molecular material.

12. The organic electroluminescent device according to claim 1, further including a transparent sealing substrate provided above the organic electroluminescent elements formed on the substrate; and
light emitted from the light-emitting layers including light transmitted through the sealing substrate as display light.

13. The organic electroluminescent device according to claim 1, the substrate being transparent; and
light emitted from the light-emitting layers including light transmitted through the substrate as display light.

14. An electronic apparatus, comprising:
the organic electroluminescent device according to claim 1.

15. An organic electroluminescent device according to claim 1, the lead-out wiring line being disposed so as to overlap the first electrode.

16. An organic electroluminescent device, comprising:
a substrate;
organic electroluminescent elements, each having a light-emitting layer between a first electrode and a second electrode, formed on the substrate;

a partition wall separating the adjacent light-emitting layers;

an insulating layer disposed under the partition wall and disposed partially over the first electrode; and a lead-out wiring line electrically connected to at least one of the first electrodes and the second electrodes and being disposed between the partition wall and the insulating layer, the lead-out wiring lines being provided between the partition walls and not being provided at a peripheral portion of the substrate.

17. An organic electroluminescent device, comprising:

a substrate;

organic electroluminescent elements, each having a light-emitting layer between a first electrode and a second electrode, formed on the substrate;

a partition wall separating the adjacent light-emitting layers;

a lead-out wiring line electrically connected to at least one of the first electrodes and the second electrodes and formed in a different layer from any of the first and second electrode; and connecting parts between the lead-out wiring line and at least one of the first and second electrodes disposed between the partition walls, the lead-out wiring lines and at least one of the first electrodes and the second electrodes being connected to each other with a plurality of separated connecting parts.

18. The organic electroluminescent device according to claim 17, the connecting parts provided between the corner of the diagonally adjacent electroluminescent elements.

* * * * *